(12) United States Patent
Sanada

(10) Patent No.: US 6,173,426 B1
(45) Date of Patent: Jan. 9, 2001

(54) METHOD OF LOCATING FAULTS IN LSI

(75) Inventor: Masaru Sanada, Tokyo (JP)

(73) Assignee: NEC Corporation, Tokyo (JP)

(*) Notice: Under 35 U.S.C. 154(b), the term of this patent shall be extended for 0 days.

(21) Appl. No.: 09/028,814

(22) Filed: Feb. 24, 1998

(30) Foreign Application Priority Data

Feb. 24, 1997 (JP) .................................................. 9-039122

(51) Int. Cl.[7] .................................................. G01R 31/28
(52) U.S. Cl. .................................................. 714/724
(58) Field of Search .................................. 714/724, 741, 714/736

(56) References Cited

U.S. PATENT DOCUMENTS

| 5,550,841 | * | 8/1996 | O'Brien | 714/724 |
| 5,790,565 | * | 8/1998 | Sakaguchi | 714/738 |
| 5,850,404 | * | 12/1998 | Sanada | 714/745 |
| 5,864,566 | * | 1/1999 | Sanada | 714/736 |
| 5,889,789 | * | 3/1999 | Sanada | 714/745 |

FOREIGN PATENT DOCUMENTS

| 6-313791 | 11/1994 | (JP) . |
| 7-146341 | 6/1995 | (JP) . |

OTHER PUBLICATIONS

Masaru Sanada, "Evaluation and Detection of CMOS–LSI with Abnormal IDDQ", *Microelectronics and Reliability*, vol. 35, No. 3, 1995, pp. 619–629.

* cited by examiner

Primary Examiner—Albert De Cady
Assistant Examiner—Esaw Abraham
(74) Attorney, Agent, or Firm—Sughrue, Mion, Zinn, Macpeak & Seas, PLLC

(57) ABSTRACT

A method of locating faults occurred in an LSI (Large Scale Integrated Circuit) is disclosed. Block-by-block logic information each varying in accordance with a test vector are output by dump processing using logic simulation on the basis of circuit connection information. The block-by-block logic information varying in accordance with the test vector are combined with Iddq information showing whether or not an Iddq error has occurred test vector by test vector. These information are used to execute calculation with each block on a test vector basis. As a result, a block involving a fault is detected. Subsequently, a fault is located in the fault block on a transistor basis by use of logic information showing whether or not the Iddq error is present in the block.

10 Claims, 15 Drawing Sheets

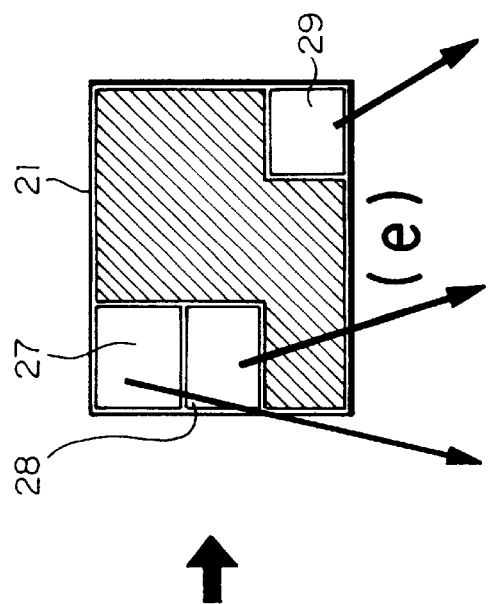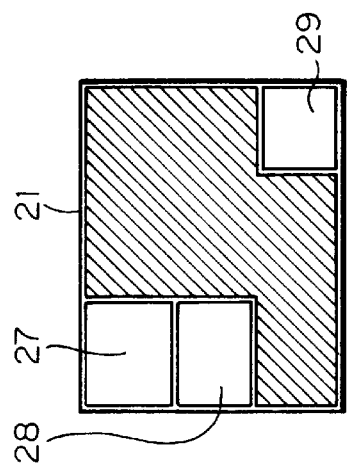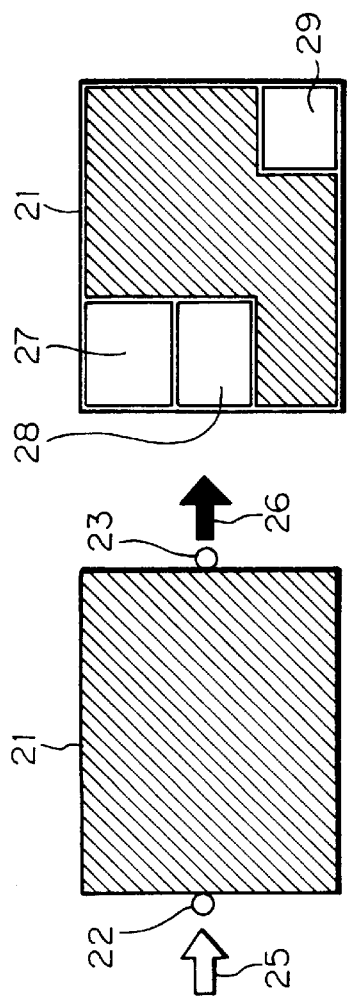
Fig. 3

(a)

| TEST VECTOR NO. | N0 1 | N0 2 | N0 3 | N0 4 | N0 5 |
|---|---|---|---|---|---|
| 1 | 0 | 0 | 0 | 0 | 0 |
| 2 | 0 | 1 | 1 | 0 | 0 |
| 3 | 0 | 1 | 1 | 0 | 0 |
| ⋮ | | | | | |
| a1 | | | A | | |
| ⋮ | | | | | |
| b1 | | | B | | |
| c1 | | | C | | |
| ⋮ | | | | | |
| a2 | | | A | | |
| ⋮ | | | | | |
| c2 | | | C | | |
| ⋮ | | | | | |
| a3 | | | A | | |
| ⋮ | | | | | |
| b2 | | | B | | |
| ⋮ | | | | | |
| c3 | | | C | | |

(b)

ABNORMAL Iddq OCCURRED AT 3 INPUT LOGIC COMBINATIONS A, B & C

COMBINATION A:
  TV(a1), TV(a2) & TV(a3)

COMBINATION B:
  TV(b1) & TV(b2)

COMBINATION C:
  TV(c1), TV(c2) & TV(c3)

ABNORMAL Iddq LOCATIONS

| TEST VECTOR NO. | N001 | N002 | N003 | N004 | N005 |
|---|---|---|---|---|---|
| 1 | 0 | 0 | 0 | 0 | 0 |
| 2 | 0 | 1 | 1 | 0 | 0 |
| 3 | 0 | 1 | 1 | 0 | 0 |
| ⋮ | | ⋮ | | | |
| a1 | | A | | | |
| ⋮ | | ⋮ | | | |
| b1 | | B | | | |
| ⋮ | | ⋮ | | | |
| c1 | | C | | | |
| ⋮ | | ⋮ | | | |
| a2 | | A | | | |
| ⋮ | | ⋮ | | | |
| c2 | | C | | | |
| ⋮ | | ⋮ | | | |
| a3 | | A | | | |
| ⋮ | | ⋮ | | | |
| b3 | | B | | | |
| ⋮ | | ⋮ | | | |
| c3 | | C | | | |
| ⋮ | | ⋮ | | | |
| | | B | | | |
| ⋮ | | ⋮ | | | |
| | | A | | | |
| ⋮ | | ⋮ | | | |
| | | B | | | |
| ⋮ | | ⋮ | | | |
| | | C | | | |
| ⋮ | | ⋮ | | | |

(c)

ALL LOGIC IDENTICAL WITH THOSE AT TVs (A,B,C) CAUSED ABNORMAL Iddq EXIST AT LOCATIONS WITH NORMAL Iddq

↓

BLOCK DETERMINED TO BE NORMAL (d)

ABNORMAL Iddq LOCATIONS

| TEST VECTOR NO. | NO1 NO2 NO3 NO4 NO5 |
|---|---|
| 1 | 0 0 0 0 0 |
| 2 | 0 1 1 0 0 |
| 3 | 0 1 1 0 0 |
| ⋮ | ⋮ |
| a1 b1 c1 d1 | A B C D |
| ⋮ | ⋮ |
| e1 f1 g1 | E F G |
| ⋮ | ⋮ |
| a2 b2 c2 d2 | A B C D |
| ⋮ | ⋮ |

(a)

ABNORMAL Iddq OCCURRED AT 2 INPUT LOGIC COMBINATION GROUPS

COMBINATION : A,B,C & D
COMBINATION : E,F & G (b)

ABNORMAL Iddq LOCATIONS

| TEST VECTOR NO. | N0 1 | N0 2 | N0 3 | N0 4 | N0 5 |
|---|---|---|---|---|---|
| 1 | 0 | 0 | 0 | 0 | 0 |
| 2 | 0 | 1 | 1 | 0 | 0 |
| 3 | 0 | 1 | 1 | 0 | 0 |
| ⋮ | | | | | |
| a1 b1 c1 d1 | A B C D | | | | |
| ⋮ | | | | | |
| e1 f1 g1 | E F G | | | | |
| ⋮ | | | | | |
| a2 b2 c2 d2 | A B C D | | | | |
| ⋮ | | | | | |
| | A B C D ⋯ E F G | | | | |
| ⋮ | | | | | |

(c)

INPUT LOGIC COMBINATION GROUPS IDENTICAL WITH 2 GROUPS (A,B,C,D) & (E,F,G) EXIST AT LOCATIONS WITH NORMAL Iddq

↓

BLOCK DETERMINED TO BE NORMAL (d)

ABNORMAL Iddq LOCATIONS

ABNORMAL Iddq LOCATIONS

| TVno. | D CLK | Q Q* |    |
|-------|-------|------|----|
| 1     | 0 0   | Q Q* |    |
| 2     | 0 1   | 0 1  |    |
| * → 3 | 0 0   | 0 1  |    |
| 4     | 0 1   | 0 1  |    |
| * → 5 | 0 0   | 0 1  |    |
| 6     | 1 1   | 1 0  | ← ABNORMAL Iddq |
| 7     | 0 0   | 1 0  |    |
| 8     | 0 1   | 0 1  |    |
| * → 9 | 0 0   | 0 1  |    |
| 10    | 1 1   | 1 0  | ← ABNORMAL Iddq |
| 11    | 0 0   | 1 0  |    |
| 12    | 1 0   | 1 0  |    |
| 13    | 0 0   | 1 0  |    |

| TVno. | IN1 | IN2 | OUT |
|---|---|---|---|
| 1 | H | H | L |
| 2 | H | L | H |
| 3 | L | H | H |
| 4 | L | L | H |

METHOD OF LOCATING FAULTS IN LSI

BACKGROUND OF THE INVENTION

The present invention relates to a method of locating faults occurring in an LSI (Large Scale Integrated Circuit) and, more particularly, to a method of narrowing down multiple faults occurring in a CMOS (Complementary Metal Oxide Semiconductor) circuit.

Conventional methods available for narrowing down the location of a fault in an LSI by CAD (Computer Aided Design) simulation estimate the location on the basis of information indicative of an error occurring at an output terminal. One of the conventional methods is a fault simulation method using a fault dictionary. The fault simulation method compares, while defining a fault in each block of an inside circuit, an output terminal, an output value and a test pattern number at which a fault is detected with data derived from actual failed samples, thereby estimating a fault. Another conventional method, generally referred to as a back tracing method, traces a logic from an output terminal toward an input terminal in the reverse direction on the basis of an output terminal, an output value and a test pattern number at which an error has been detected. Specifically, the back tracing method inputs a preselected signal to the input terminal of an LSI. When the resulting signal appearing on the output terminal of the LSI differs from an expected value, the method picks up, among signals spreading from the output terminal toward the input terminal, a signal carrying a fault and thereby estimates the location of a fault. After defining a fault at the estimated location, the method again executes logic simulation in order to verify coincidence between the estimated fault and the actual fault. It is a common practice with the back tracing method to examine a plurality of output error locations and narrow down a fault while limiting a false fault signal on the basis of a combination of the above locations.

However, the problems with the conventional methods are that analysis is not practicable with an LSI having multiple faults therein, and that the amount of simulation data is too huge to render the methods practical. The analysis of an LSI with multiple faults is not practicable unless the number of multiple faults is known. Specifically, because error data on the output terminal alone cannot show how many faults exist, the analyst must estimate the number of faults by referencing the error data on the output terminal. Therefore, if the estimated number of errors is wrong, the analyst executes simulation with the wrong number of errors, resulting in an incorrect result of detection.

More specifically, the fault simulation method using a fault dictionary can deal only with a stuck-at fault (stuck-at-0 or stuck-at-1) model, i.e., it cannot simulate open faults. This kind of method therefore lacks in general-purpose applicability as to the location of a fault mode. This is because faults to be dealt with by fault simulation are modeled logical faults, but open errors are not definite in logic. Moreover, the number of faults to be defined must be sequentially defined for all signal lines constituting a circuit, resulting in an impractical amount of data. It is generally understood that the number of faults (V0) to be defined is proportional to the third to fourth power of the number (L) of circuit devices constituting an LSI, i.e., ln(V0) (3~4)·ln (L).

The back tracing method cannot determine the number of faults occuring in a circuit because it relies only on information relating to an output terminal error. Further, while this kind of method can narrow down the location of an error only if a plurality of output error terminals exist, it assumes only a single fault. In addition, because signals spread from the output terminal toward the input terminal, a prohibitive number of false faults are detected and prevent the actual fault from being located. Therefore, it is difficult to narrow down a fault with the back tracing method alone. A current trend is toward a method linked with an EBT (Electron Beam Tester) or similar physical analysis implement and excluding false fault locations from candidates by obtaining a non-contact potential contrast image or a logical operation waveform, as reported at, e.g., the LSI Testing Symposium.

Technologies relating to the present invention are disclosed in, e.g., Masaru Sanada (inventor of the present invention) "EVALUATION AND DETECTION OF CMOS-LSI WITH ABNORMAL IDDQ", Microelectronics and Reliability, Vol. 35, No. 3, pp. 619–629, 1995, and Japanese Patent Laid-Open Publication Nos. 6-313791 and 7-146341.

SUMMARY OF THE INVENTION

It is therefore an object of the present invention to provide an LSI fault locating method capable of narrowing down multiple faults of an LSI easily and rapidly with a minimum amount of data and without regard to output terminal errors, and thereby determining the number of faults and the locations where they occurred.

A method of detecting a fault occurring in an LSI of the present invention includes the step of detecting, among blocks which are basic logic circuit units constituting the LSI, a fault block by executing a logical operation with each of the blocks by using block-by-block logical operation information and test vector numbers causing an Iddq value, which is a leak current at a quiescent state of the logical operation of the LSI, to exceed a preselected value. The locations of multiple faults are narrowed down by using logic information particular to the fault block and corresponding to the test vector numbers causing an Iddq error to occur.

BRIEF DESCRIPTION OF THE DRAWINGS

The above and other objects, features and advantages of the present invention will become apparent from the following detailed description taken with the accompanying drawings in which:

FIG. 3 demonstrates a procedure for rearranging the results of logic simulation effected with each block of an LSI;

DESCRIPTION OF THE PREFERRED EMBODIMENT

Figure 1:
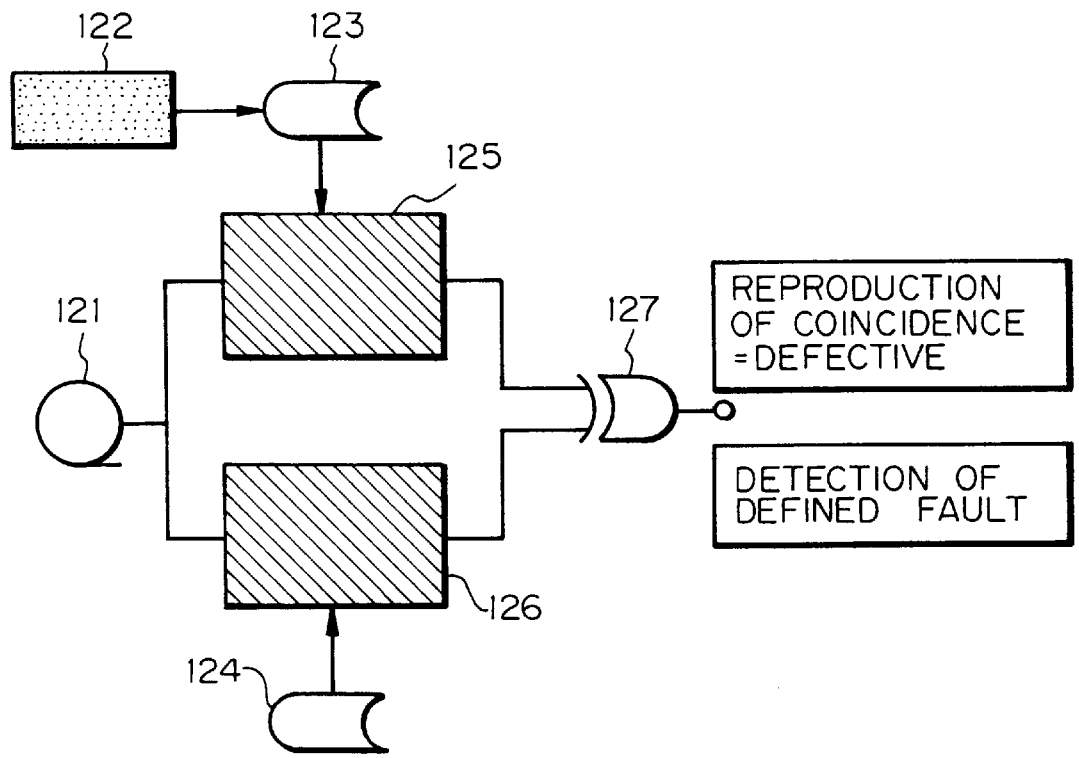
FIG. 1 is a block diagram schematically showing a conventional fault simulation method using a fault dictionary.

To better understand the present invention, brief reference will be made to the previously stated conventional fault simulation method using a fault dictionary, shown in FIG. 1. There are shown in FIG. 1 a test vector 121, a fault definition 122, LSI logical connections 123 and 124, logical simulations 125 and 126, and a comparison 127. As shown, to locate a fault location, use is made of a normal logic value on the output terminal of the LSI and output from the logic simulation 126, and a fault logic value output from the logic simulation 125 by executing the fault definition 122 node by node. A logic appearing on the output terminal in response to the test vector 121 applied to the input terminal is subjected to the comparison 127. As a result, a fault definition position identical with the actual fault sample is detected.

The above fault simulation method and the back tracing method, which is another conventional method, each has some problems left unsolved, as discussed earlier.

Generally, when a CMOS logic circuit has a physical defect thereinside, an abnormal value tends to appear in Iddq.

The abnormal Iddq value can be regarded as a signal revealing a physical fault inside an LSI circuit. For details of this tendency, reference may be made to "EVALUATION AND DETECTION OF CMOS-LSI WITH ABNORMAL IDDQ" mentioned earlier. The present invention is based on the above occurrence.

An ASIC (Application Specific Integrated Circuit) typified by a gate array is implemented as a desired electric circuit by combining circuits constituting basic logics and generally referred to as blocks. The method of the present invention uses this kind of designing system. In accordance with the present invention, when test vectors are sequentially input to the input terminal of an LSI, block-by-block logical operation information varies in response to each test vector. Such logical operation information and test vector numbers causing the Iddq or leak current to exceed a preselected value are used to execute block-by-block logical operation, thereby detecting a fault block. Subsequently, logic information corresponding to the test vector number which caused an abnormal Iddq to occur in the fault block is used to narrow down a fault.

The block-by-block logical operation information mentioned above is a block-by-block combination of input logics varying in accordance with the test vector input to the LSI.

Figure 2:
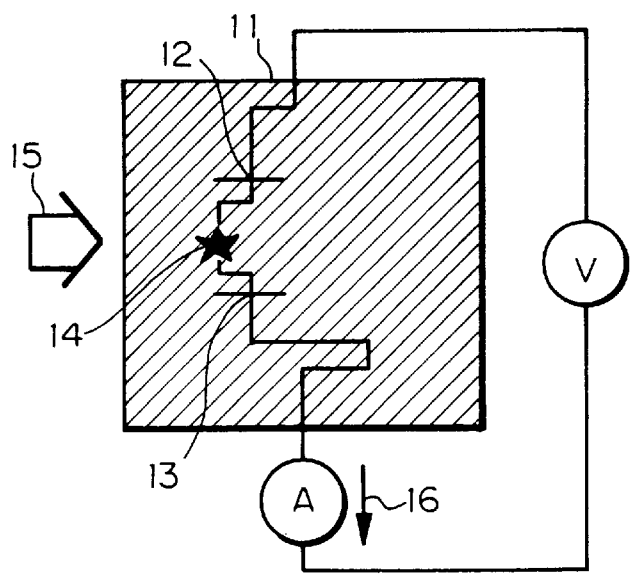
FIG. 2 shows how a penetration current flows due to a physical fault.

When a CMOS logic circuit involves a physical defect thereinside, an abnormal Iddq tends to appear, as stated earlier. FIG. 2 shows how a penetration current flows due to a physical fault. There are shown in FIG. 2 an LSI 11, a power supply (Vdd) 12, ground (GND) 13, a location of a physical fault 14, a test vector 15, and an abnormal Iddq 16. As shown, the abnormal Iddq or penetration current 16 flows from the power supply 12 to ground 13 via the fault 14 or due to the influence of the fault 14 on the basis of a logic set by any test vector 15.

A fault occurring in the CMOS circuit of an ASIC can be narrowed down by use of block-by-block logic simulation information varying on a test vector basis, and a test vector number causing an abnormal Iddq to occur.

The block-by-block logic simulation information will be described first, and then how a test vector number causing an abnormal Iddq to occur is detected will be described. This will be followed by the description of a procedure particular to the present invention and a system for narrowing down a fault block.

(1) Block-by-Block Logic Simulation Information (FIG. 3)

FIG. 3 demonstrates a procedure for rearranging the results of block-by-block logic simulation of an LSI 21. Specifically, FIG. 3 shows in (a) an input to and an output from the LSI 21, shows in (b) a test vector table listing a relation between the inputs to and outputs from the LSI 21, shows in (c) blocks included in the LSI 21, shows in (d) a block-by-block output logic variation table on an SIM (Systems Integration Model) and varying with the elapse of time, shows in (e) outputs from the various blocks of the LSI 21, and shows in (f) dump lists each showing input logics respectively associated with the test vectors block by block. There are also shown in FIG. 3 an input terminal 22, an output terminal 23, a test vector 25, an output 26, a block B1 27, a block B2 28, and a block Bn 29.

Logic simulation is a tool available for verifying a n expected value appearing on the output terminal 23 in response to the test vector 25 input to the input terminal 22.

Logic simulation is used to verify timings and inside delays at the same time as the confirmation of the operation of electric circuitry. It therefore follows that block-by-block logics appearing on the output terminal 23 and information representative of variations of the logics with respect to time suffice the verification. However, because simulation data necessary for the method to be described are block-by-block input logic information varying on a test vector number basis, the results of usual logic simulation must be rearranged.

FIG. 3 shows a procedure for rearranging the results of logic simulation into results to be dealt with by the present invention. As shown, a logic appearing on the output terminal of the individual block and time varying information representative of the variation of the logic with respect to time are transformed to the same logic and test vector number varying information representative of the variation of the logic with respect to test vector number. Further, because the output terminal of one block is connected to the input terminal of the following block, the logic and test vector varying information are transformed to logic information input to the input terminal block by block and test vector number varying information.

Figure 4:
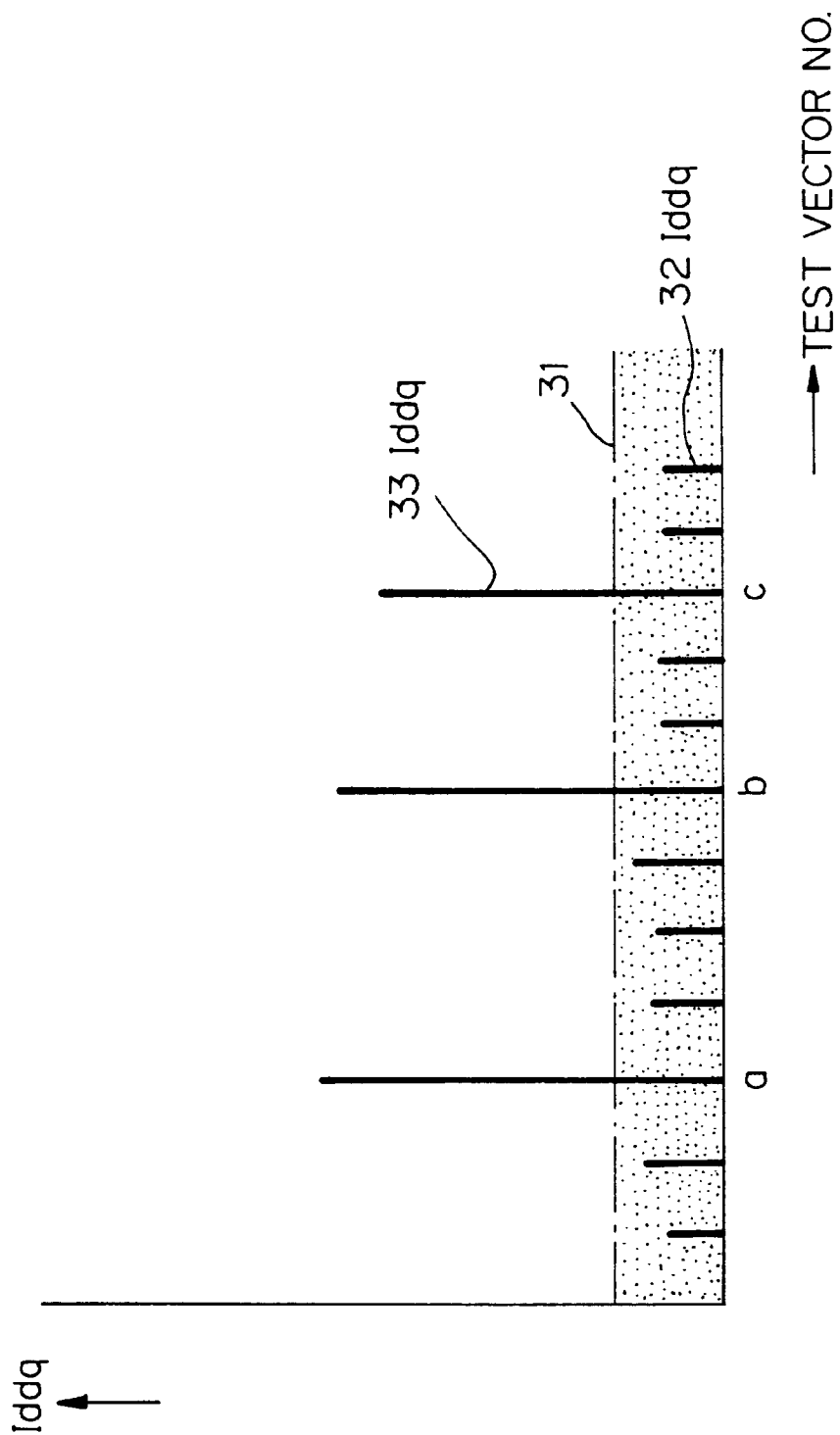
FIG. 4 is a graph representative of Iddq (Quiescent Vdd Supply Current) error information obtained with consecutive test vectors.

(2) Test Vector Number Causing Abnormal Iddq to Occur (FIG. 4)

Whether or not an abnormal Iddq value occurs is determined on a test vector basis (test vector information), as follows. The test vectors are sequentially input to the input terminal of a fault LSI so as to measure a leak current in the quiescent state of the logic of each test vector. A leak current exceeding a standard value is determined to be an abnormal Iddq value. FIG. 4 is a graph showing specific abnormal Iddq information obtained with the consecutive test vectors. There are shown in FIG. 4 an Iddq threshold 31, normal Iddq values 32. and abnormal Iddq values 33. In FIG. 4, the X axis and Y axis indicate the test vector numbers (TV no. hereinafter) and Iddq values, respectively. As shown, the Iddq value is lower than the standard value when the LSI is free from faults; for example, it is lower than 1 $\mu$A when a penetration current does not flow. However, a penetration current several hundred to several thousand times higher than the standard value flows when the LSI has an Iddq error.

Figure 5:
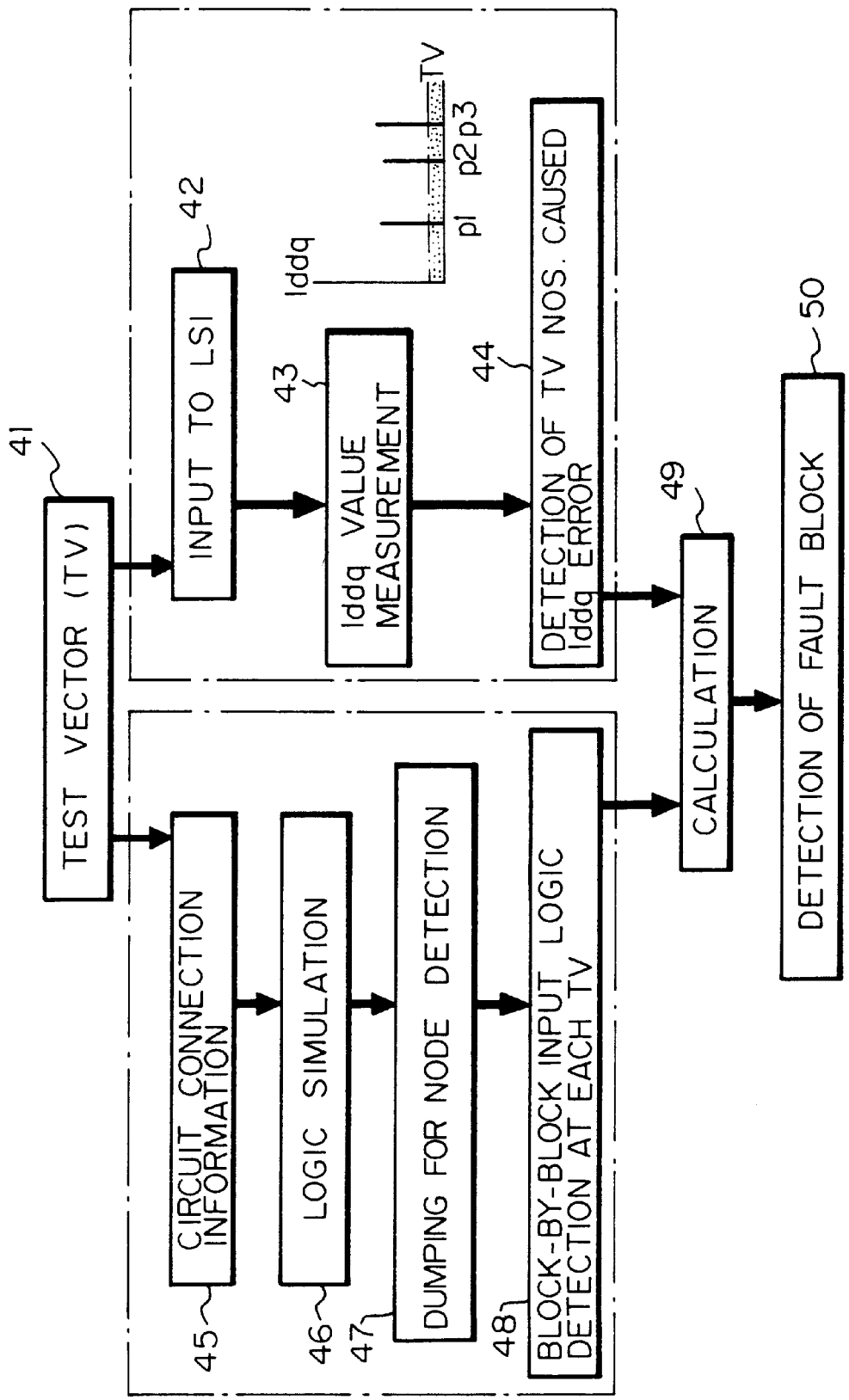
FIG. 5 is a flowchart demonstrating a procedure embodying the present invention.

(3) Procedure Unique to the Invention (FIG. 5).

FIG. 5 is a flowchart showing the procedure unique to the present invention. There are shown in FIG. 5 a test vector (TV) (step 41), application of the test vector to an LSI (step 42), measurement of Iddq values (step 43), detection of TV numbers which cause abnormal Iddq values to occur (step 44), circuit connection information (step 45), logic simulation (step 46), dumping for detecting inside circuit nodes (step 47), detection of block-by-block input logics for each TV (step 48), calculation (step 49), and detection of a fault block (step 50).

In accordance with the present invention, the test vectors for testing the logical operation of an LSI are used to detect the logic information of the individual block constituting the LSI and varying in accordance with the test vector and Iddq information showing whether or not an abnormal Iddq is present in relation to each test vector.

First, the block-by-block input logic information 48 varying in accordance with the test vector 41 is output by the above system. At this instant, each block is designated on the basis of a text name by dumping 47 which uses the circuit connection information 45 and logic simulation 46 adapted for circuit verification. The resulting block-by-block input logic information 48 are combined with the Iddq information associated with the test vectors, so that the calculation 49 is executed with each block on a test vector basis. As a result, the detection of a block involving a fault is achieved (step 50). Subsequently, a fault is located in the fault block 50 on a transistor basis by use of the Iddq information derived from the block 50.

Figure 6:
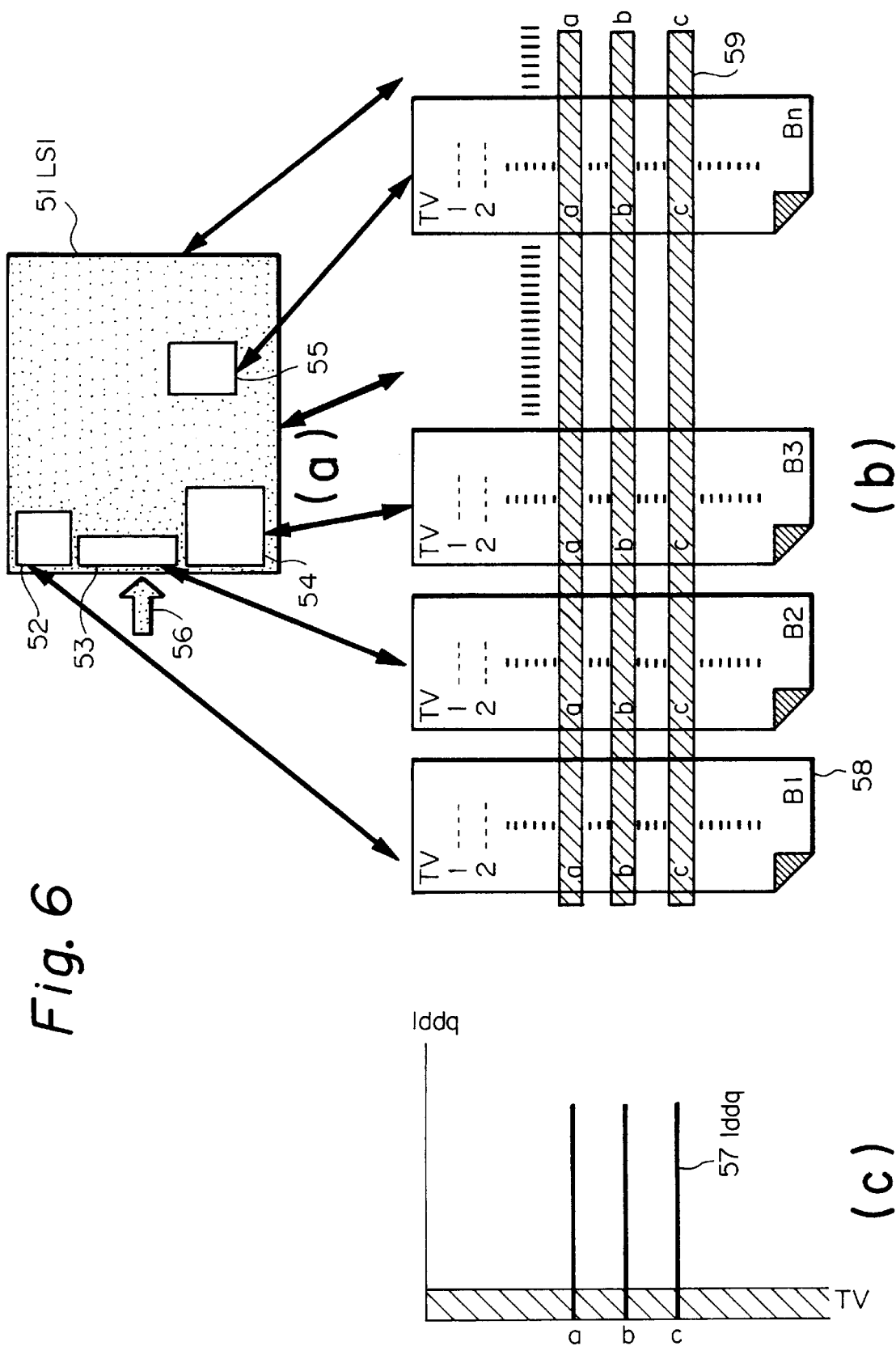
FIG. 6 is a view for describing the basic concept of the present invention for narrowing down a fault block.

(4) System for Narrowing Down Fault Block (FIG. 6)

FIG. 6 shows the basic concept of the present invention for narrowing down a fault block. Specifically, FIG. 6 shows in (a) blocks included in an LSI 51, shows in (b) dump lists 58 each relating to a particular block, and shows in (c) Iddq information associated with the dump lists (b). The LSI 51 includes a block B1 52, a block B2 53, a block B3 54, and a block Bn 55. There are also shown in FIG. 6 a test vector 56, abnormal Iddq values 57, and locations 59 where abnormal Iddq values occurred.

The test vector 56 is input to the input terminal of the LSI 51 made up of a plurality of blocks (B1, B2, B3, . . . , Bn, . . . ). The input logic reaches the output terminal of the LSI 51 while sequentially evolving itself in the consecutive blocks.

The logical state of the individual block is detected for each test vector, as represented by the dump lists 58 in FIG. 6, (b). The Iddq value detected in the LSI for each test vector is the sum of Iddq values occurring in the consecutive blocks (B1, B2, B3, . . . , Bn, . . . ) and usually remains below a standard value. However, when any one of the blocks involves a physical defect, an abnormal current appearing in the defective block is detected as an abnormal Iddq value of the LSI.

As shown in FIG. 6, (c), assume that abnormal Iddq values 57 occur at the test vectors or TV nos. a, b and c. Then, because the TV nos. a, b and c respectively correspond to the TV nos. a, b and c of the block-by-block dump lists (FIG. 6, (b)), it is possible to locate a block involving an Iddq error by comparing input logics associated with the above test vectors and input logics normally associated with the test vectors, as will be described specifically later.

(5) Fault Block Location

How a block involving an Iddq error is located will be described hereinafter. Blocks constituting an ASIC are generally classified into two kinds of circuits, i.e., combination circuits and sequential circuits. A combination circuit is such that when a signal is input to the input terminal of a block, its logic is directly output via a circuit inside the block. Circuits of this kind include basic gates (AND gate, OR gate, NAND gate, inverter, etc.) and even ALUs (Arithmetic/Logic Units), adders and other large scale circuits. A sequential circuit once stores data therein in synchronism with a clock signal and then outputs it in response to the next clock signal. Circuits of this kind include flip-flops, registers, and latches. These t w o different kinds of circuits each is diagnosed by a particular system.

Figure 7:
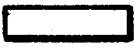
FIG. 7 shows a procedure for locating a fault block included in a combination circuit.
Figure 7:
Figure 7:
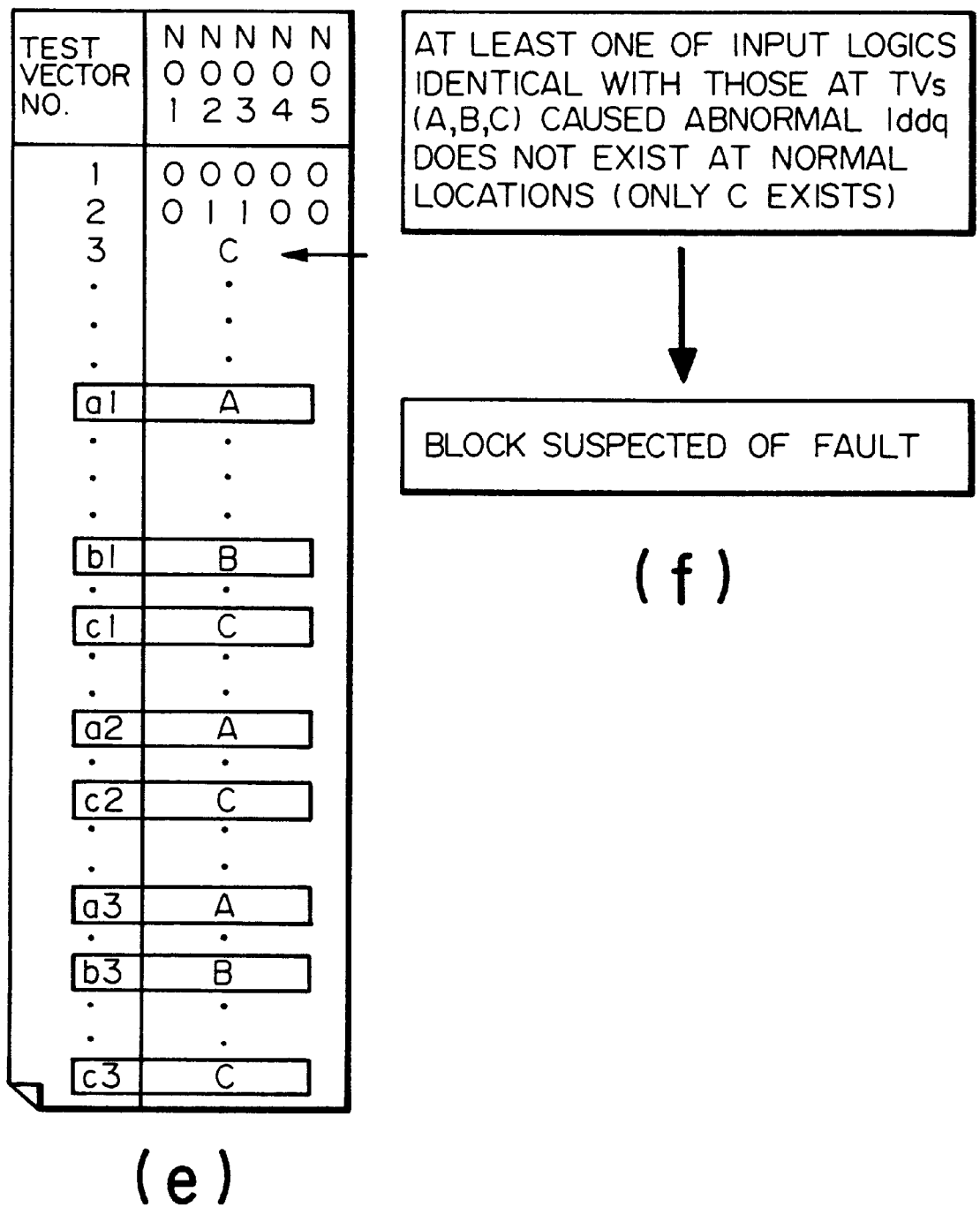

(5-1) Fault Block Location with Combination Circuit (FIG. 7)

Referring to FIG. 7, the location of a fault block in a combination circuit will be described. FIG. 7 shows in (a) a dump list output with a five-input combination circuit, shows in (b) a flowchart representative of the occurrence of an abnormal Iddq value, shows in (c) another dump list associated with the combination circuit, shows in (d) a specific case wherein a given block is determined to be normal, shows in (e) still another dump list associated with the combination circuit, and shows in (f) a specific case wherein a given block is suspected of a fault.

As shown in FIG. 7, (c), three different combinations of input logics A, B and C exist in which an abnormal Iddq value occurs. The combination A consists of test vectors TV(a1), TV(a2) and TV(a3) while the combination B consists of test vectors TV(b1) and TV(b2). Further, the combination consists of test vectors TV(c1), TV(c2) and TV(c3).

Whether or not combinations of input logics identical with the above combinations A, B and C exist at test vectors having normal Iddq values is determined by use of a computer (PC or EWS).

A specific case wherein a given block is determined t o be normal is shown in FIG. 7, (c) and (d). As shown, a block in which all the combinations A, B and C of input logics exist in normal test vectors is determined to be normal. Specifically, when a combination of input logics identical with the combination A exists in normal test vectors whose Iddq values are normal, it is determined that the combination A of the block is not an input logic suggesting a fault. Next, when a combination of input logics identical with the combination B exists at test vectors whose Iddq values are normal, it i s determined that the combination B is not an input logic suggesting a fault. Likewise, when a combination of input logics identical with the combination C exists at test vectors whose Iddq values are normal, it is determined that the combination C is not an input logic suggesting a fault. Because none of the combinations A–C suggests a fault, the block is determined to be normal. This is the end of examination of the block.

A specific case wherein the block is suspected of a fault is shown in FIG. 7, (e) and (f). As shown, when one or more of the combinations A–C of input logics do not exist in combinations of input logics corresponding to test vectors whose Iddq values are normal, as determined by the above examination, the block is suspected of a fault for the following reasons.

As for multiple faults, there are two difference cases, one wherein they concentrate in a single block and the other wherein they occur in a plurality of blocks. Assuming the suspected case shown in FIG. 7, (e) and (f), when all the faults concentrate in a single block, an abnormal Iddq value necessarily occurs if the three combinations A–C of input logics causing an abnormal Iddq value to occur exist, i.e; that is, the combinations A–C do not occur in combinations corresponding to test vectors whose Iddq values are normal.

Assume the case wherein multiple faults occur in a plurality of blocks. Then, when one (A) of the three different combinations A–C exists in combinations corresponding to test vectors whose Iddq values are normal, it can be determined that the combination A is ascribable to an Iddq error occurring in another block. As a result, the other two combinations B and C are determined to be test vectors causing an Iddq error to occur, i.e., the block is suspected of a fault.

Likewise, when two (A and B) of the three combinations A–C exist in combinations corresponding to test vectors whose Iddq values are normal, it can be determined that the combinations A and B are ascribable to an Iddq error occurring in another block. As a result, the remaining single combination C is determined to be test vectors causing an Iddq error to occur, that is, the block is suspected of a fault.

Further, when all the three combinations A–C exist in combinations corresponding to test vectors whose Iddq values are normal, it can be determined that the combinations A, B and C are ascribable to an Iddq error occurring in another block. As a result, it is determined that the block involves no test vectors causing an Iddq error to occur, i.e., it is normal.

Figure 8:
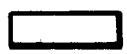
FIG. 8 shows a procedure for locating a fault block included in a sequential circuit.
Figure 8:
Figure 8:
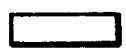

(5-2) Fault Block Location with Sequential Circuit (FIG. 8)

Referring to FIG. 8, the location of a fault block in a sequential circuit will be described. FIG. 7 shows in (a) a dump list associated with a five-input sequential circuit, shows in (b) an Iddq error occurrence flowchart, shows in (c) another dump list associated with the sequential circuit, shows in (d) a flowchart in which a block is determined to be normal, shows in (e) another dump list associated with the sequential circuit, and shows in (f) a flowchart in which a block is suspected of a fault.

As shown in FIG. 8, (a) and (b), seven different combinations A, B, C, D, E, F and G of input logics causing an Iddq error to occur exist. The combinations A–G appear at test vectors in a unique manner, i.e., the combinations A–D and combinations E–G appear in groups at continuous test vectors.

In this case, whether or not the combination groups A–D and E–G exists at test vectors whose Iddq values are normal is determined, as follows.

A specific case wherein a block is determined to be normal is shown in FIG. 8, (c) and (d). When combination groups identical with the combination groups A–D and E–G, respectively, exist at test vectors whose Iddq values are normal, the block is determined to be normal. More specifically, when a combination group identical with the combination group A–D exists at test vectors whose Iddq values are normal, it is determined that the combination group A–D of the block is not an input logic suggesting a fault. Subsequently, when a combination group identical with the combination group E–G exists at test vectors whose Iddq values are normal, it is determined that the combination group A–D of the block is not an input logic suggesting a fault. Because neither the combination group A–D nor the combination group E–G suggests a fault, the block is determined to be normal. This is the end of examination of the block.

A specific case wherein the block is suspected of a fault is shown in FIG. 8, (e) and (f). As shown, when one or both of the combination groups A–D and E–G do not exist at test vectors whose Iddq values are normal, as determined by the above examination, the block is suspected of a fault for the following reason.

Assuming the case shown in FIG. 8, (e) and (f), when all the faults concentrate in a single block, an Iddq error necessarily occurs if the two combination groups A–D and E–G each causing an Iddq error to occur exist. Therefore, such combinations would not occur in combination groups corresponding to test vectors whose Iddq values are normal.

When faults occur in a plurality of blocks, and when the combination group A–D exists in groups corresponding to test vectors whose Iddq values are normal, it can be determined that the combination group A–D is ascribable to Iddq error information of another block. As a result, it is determined that the other combination group E–G causes an Iddq error to occur, i.e., the block is suspected of a fault.

In the sequential circuit, an Iddq error may occur in a single test vector as distinguished from a group of continuous test vectors. For example, combinations causing an Iddq error to occur may occur in the form of the above group A–D and independent combinations E, F and G. In this case, the examination is executed with the group A–D with respect to continuous test vectors, and with the independent combinations E, F and G, i.e., four different kinds of examination are executed. Further, even if a combination identical with a single combination exists in the group A–D (e.g. B=F), they are considered independently of each other. The examination is executed with the group A–D with respect to continuous test vectors and then with the single test vector (F).

Figures 9A, 9B:
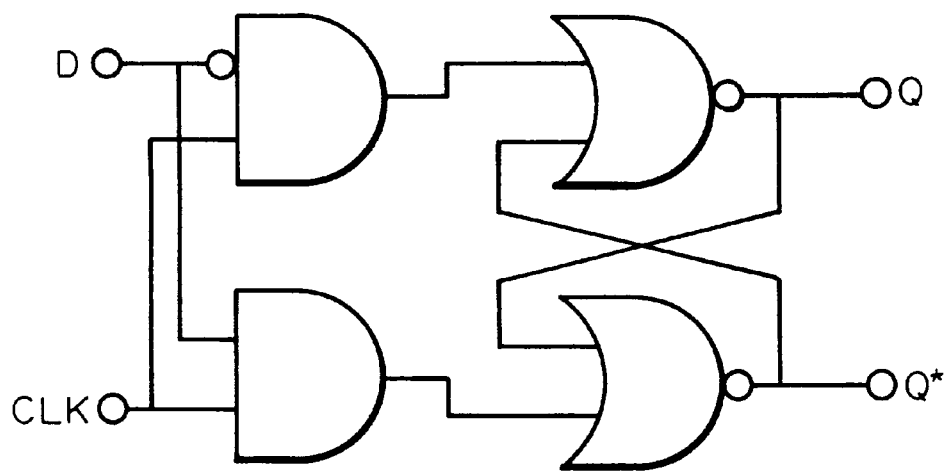
FIGS. 9A and 9B show a procedure for analyzing a sequential circuit.

The above reason for decision will be described more specifically, taking a D type flop-flop (DF/F hereinafter) as an example. FIGS. 9A and 9B respectively show a DF/F and a DF/F logic table (truth table) representative of a diagnosis system applicable to a sequential circuit. As shown in FIG. 9A, the DF/F has a terminal group made up of two inputs (data terminal Data and clock terminal CLK) and two outputs (Q and Q*) implemented as a single inverter, two two-input NAND gates, and two two-input NOR gates. It is to be noted that Q* means the inverted logic of Q. Assume that an Iddq error occurs when the two-input NOR gate at the Q output side goes high. Then, an Iddq error occurs at TV nos. 6, 7, 10, 11, 12 and 13 on the truth table shown in FIG. 9B.

Assume that the above TVs are a single combination of input logics. Then, paying attention to TV nos 7, 11 and 13, identical input logics (D=0 and CLK=0) are set at TV nos. 3, 5 and 9. However, an Iddq error has not occurred in any of the input logics of TV nos. 3, 5 and 9. This is because a sequential circuit once stores data therein in synchronism with a clock signal and then outputs it in response to the next clock, as stated earlier.

Specifically, as shown in FIG. 9B, logics held at TV nos. 7, 11 and 13 indicate that the two-input NOR gate at the Q output side and the two-input NOR gate at the Q* output side are in a high level and a low level, respectively. By contrast, logics held at the TV nos. 3, 5 and 9 indicate that the NOR gate at the Q output side and the NOR gate at the Q* output side are in a low level and a high level, respectively. Therefore, t h e condition wherein an Iddq error occurs when the NOR gate at the Q output side goes high is determined to be a fault on the basis of the TV nos. 7, 11 and 13. It follows that to locate a fault of a sequential circuit, setting of logics in the DF/F and the input logics held must be examined as a single combination group {TV nos. 6 and 7} and {TV nos. 10, 11, 12 and 13}. That is, whether or not a fault exists in the block of a sequential circuit cannot be determined unless whether or not a combination group causing an Iddq error to occur is present in combination groups at normal test vectors.

Figure 10:
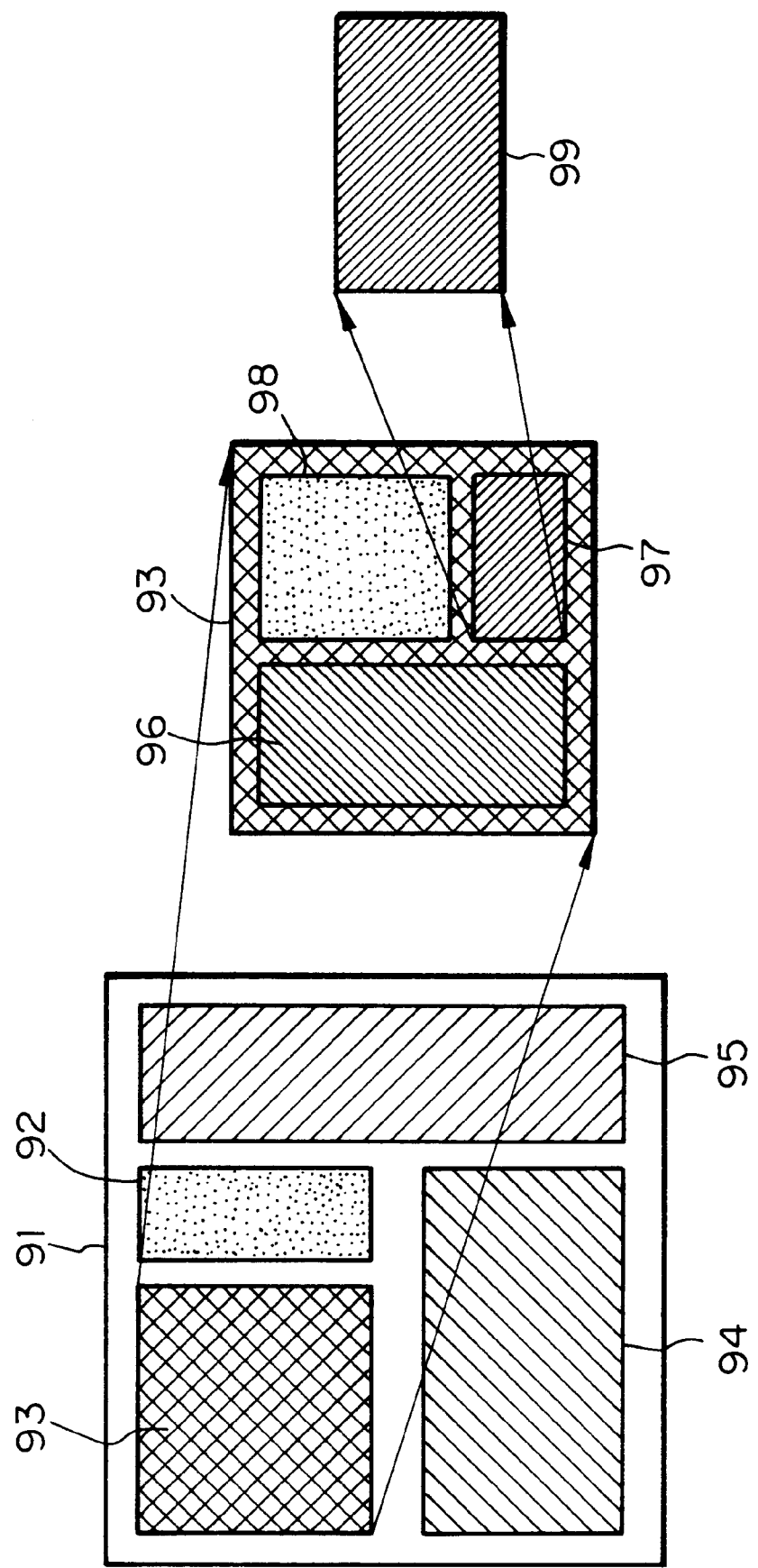
FIG. 10 shows a system in which an LSI is divided into hierarchical layers in order to narrow down a failure block.

(6) Narrowing Down of Fault Block by Hierarchical Division (FIG. 10)

Referring to FIG. 10, a system for narrowing down a fault block by dividing an LSI hierarchically is shown. There are shown in FIG. 10 an LSI 91, a sequential circuit 92, combination circuits 93, 94 and 95, a block (b1) 96. a block (b2) 97, a block (b3) 98, and a basic block 99.

In the case of a hierarchical block configuration, it is a common practice to execute analysis with each block having a basic circuit arrangement and prepared beforehand. The basic circuit arrangement is referred to as a library and is used at a design stage. However, the number of such blocks will be huge when it comes to an LSI. In light of this, the block configuration inside an LSI may be rearranged in any desired size so as to vary the block configuration. The prerequisite with the rearrangement is that a combination circuit and a sequential circuit each be divided into a particular hierarchical unit. This is because the calculation system differs from the combination circuit to the sequential circuit.

Specifically, in FIG. 10, the combination circuits 93–95 and sequential circuit 92 exist together. The combination circuits 93–95 are respectively implemented as layers a1, a2 and a3 easy to divide with the sequential circuit 92 therebetween. When the hierarchical block (a1) 93 is detected as a fault block, a fault is narrowed down with respect to components bi, b2 and b3 constituting the block 93. Finally, the block (b2) 97 is detected which is the minimum unit or basic logic circuit.

Figures 11A, 11B:
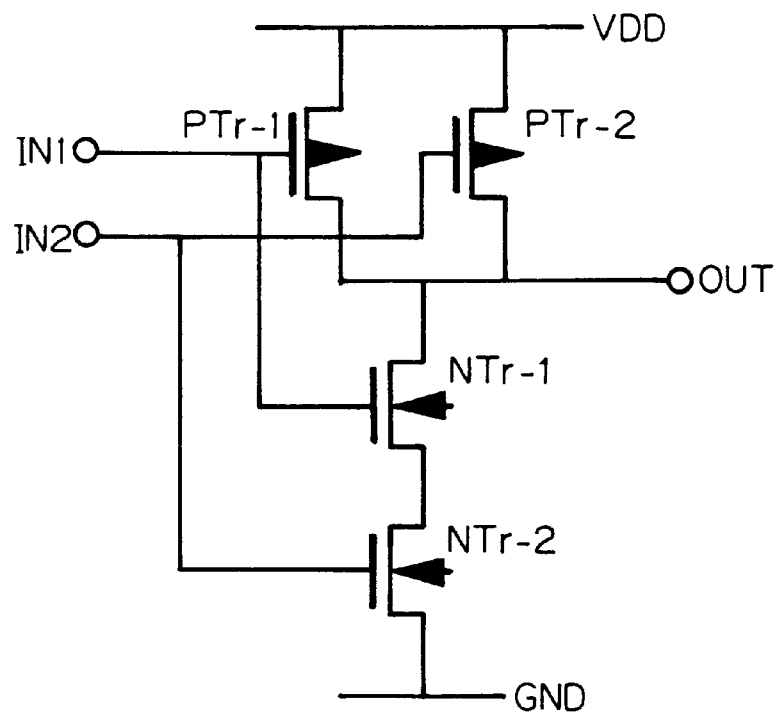
FIGS. 11A and 11B show a procedure for detecting a fault transistor by logic simulation.

(7) Narrowing Down Fault on Transistor Basis (FIGS. 11A & 11B)

Subsequently, a fault is narrowed down with respect to transistors constituting the basic block 99. Generally, the basic logic circuit has several to several tens of transistors and is implemented as an OR gate, NOR gate, NAND gate, AND gate, inverter, flip-flop or similar elementary logical operation unit. The same narrowing method applies to both of a combination circuit and a sequential circuit. Because such a basic logic circuit allows a transistor turning on and off in synchronism with an input logic to be clearly determined, a fault transistor can be easily located by logic simulation. The procedure will be described in relation to a two-input NAND gate by way of example.

FIG. 11A shows a two-input NAND gate while FIG. 11B tabulates, paying attention to all possible combinations of input logics of the NAND gate, a correlation between a truth table and Iddq values. Assume that an Iddq error occurs at, among four different combinations of input logics TV1–TV4, the combination TV3 (low level and high level respectively input to input terminals IN1 and IN2), and that the other combinations are normal. How a fault transistor is detected by use of such information will be described. Usually, this method is executed by detecting a transistor turning on and off and a test vector where it is doing so on a logic simulation basis.

In FIGS. 11A and 11B, p-channel transistors 1 and 2 (PTr-1 and PTr-2 hereinafter) and n-channel transistors 1 and (NTr-1 and NTr-2 hereinafter) each turns on and off at the

| TV no. | PTr-1 | PTr-2 | NTr-1 | NTr-2 | Iddq |
|--------|-------|-------|-------|-------|------|
| TV1 | OFF | OFF | ON | ON | normal |
| TV2 | OFF | OFF | ON | OFF | normal |
| TV3 | ON | OFF | OFF | ON | abnormal |
| TV4 | ON | ON | OFF | OFF | normal |

Further, the following two different paths along which an Iddq error occurs exist in the two-input NAND gate:

1. Vdd→PTr1→NTr1→NTr2→GND
2. Vdd→PTr2→NTr1→Ntr2→GND

By verifying the above two paths and the ON/OFF conditions of the transistors, it is possible to present the paths in terms of the ON/OFF conditions of the transistors, as follows:

| Path 1 | | | | |
|--------|---|---|---|---|
| TV1 | OFF | ON | ON | normal |
| TV2 | OFF | ON | OFF | normal |
| TV3 | ON | OFF | ON | abnormal |
| TV4 | ON | OFF | OFF | normal |
| Path 2 | | | | |
| TV1 | OFF | ON | ON | normal |
| TV2 | ON | ON | OFF | normal |
| TV3 | OFF | OFF | ON | abnormal |
| TV4 | ON | OFF | OFF | normal |

Therefore, a penetration current flows when the transistors PTr2 and NTr1 fail and remain in their ON states. However, because the Iddq value of TV1 is normal, the transistor PTr2 is determined to be normal cause a fault thereof would be contradictory. By verifying the paths and 2, it is determined that when the transistor NTr1 fails and remains in its ON state, a penetration current flows.

Even with a basic logic circuit including several tens of transistors, a fault transistor can be detected in a short period of time if a procedure similar to the above verification procedure is executed by use of a computer.

Figure 12:
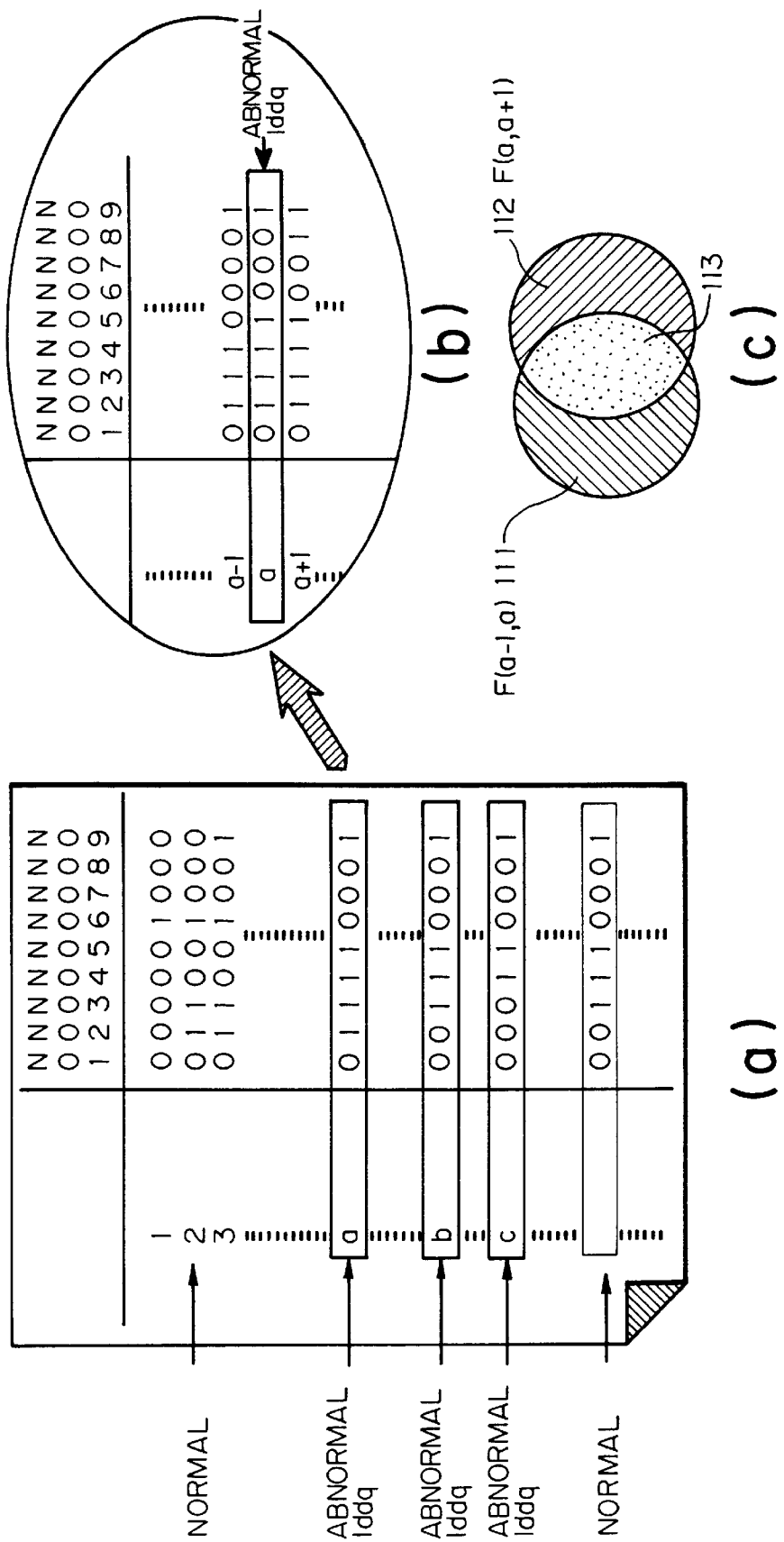
FIG. 12 shows a procedure for narrowing down a fault in a combination circuit.

(8) Narrowing Down Failure of Combination Circuit (FIG. 12)

How a fault occurring in a combination circuit is located will be described with reference to FIG. 12. FIG. 12 shows in (a) a correlation between a truth table and Iddq values, shows in (b) a part of the correlation in an enlarged scale, and shows in (c) a procedure for narrowing down a failed device. There are shown in FIG. 12 the transition of a test vector 111 and 112 and a failed device 113.

Specifically. by using test vectors where an Iddq error has occurred and normal test vectors, variation in the logic of each test vector where an Iddq error has occurred is detected by conventional simulation. Particularly, test vectors where an Iddq error has occurred are important. In the case of a combination circuit, a failed device can be easily located by conventional simulation on the basis of variation in the inside logic before and after a test vector caused an Iddq error to occur. Specifically, as shown in FIG. 12, an Iddq error occurs on the transition from a TV no. (a−1) to a TV no. (a), i.e., {F(a−1, a)}. At this instant, only an input pin no. 5 changes from "0" to "1". A failed device can be located on the basis of such a change by logic simulation. Subsequently, on the transition from the TV no. (a) to a TV no. (a+1), i.e., {F(a, a+1)}, a normal state is restored; only an input pin no. 8 changes from "1" to "0". When a plurality of failed devices are detected by preprocessing, they can be further narrowed down. By repeating such processing with all test vectors where an Iddq error has occurred, it is possible to locate a failed device.

In summary, it will be seen that the present invention provides a method of locating faults in an LSI and having various unprecedented advantages, as enumerated below.

(1) The location of a fault can be narrowed down without regard to whether or not an output terminal error exists. This is the major advantage achievable with the present invention.

(2) The location of a fault can be easily narrowed down. Specifically, the method is practicable only if blockby-block dump lists based on logical simulation, which is a verifying tool particular to an LSI design stage, and test vector data caused an Iddq to occur are available. A fault can therefore be easily narrowed down even when circuitry is not known.

(3) Analysis is practicable without resorting to failed samples because only the test vector numbers caused an Iddq error to occur suffice.

(4) The number and locations of faults can be detected by calculation even when the number of multiple faults is not known.

(5) Because the method needs only calculation available with a computer, it promotes rapid processing. Even when an LSI is scaled up, the method is not susceptible to the capacity of a computer because block-by-block calculation can be done. Further, calculation is effected block by block and thereby implements rapid parallel processing.

(6) The method is practicable without regard to the size of an Iddq value. The test vector numbers caused an Iddq error to occur and particular to the present invention are not related to the size of an Iddq value. Therefore, even a fault occurred in a sample only slightly different from a normal LSI can be narrowed down.

Various modifications will become possible for those skilled in the art after receiving the teachings of the present disclosure without departing from the scope thereof.

What is claimed is:

1. A method of detecting a fault occurring in an LSI circuit, comprising the steps of:

detecting, among blocks which are basic logic circuit units constituting the LSI circuit, a fault block by executing a logical operation with each of the blocks by using block-by-block logical operation information and test vector numbers causing an Iddq value, which is a leak current at a quiescent state of a logical operation of the LSI, to exceed a preselected value; and narrowing down locations of multiple faults by comparing occurrences of logic information particular to the fault block and corresponding to the test vector numbers which cause an Iddq error to occur with respect to occurrences of logic information particular to the fault block and corresponding to the test vector numbers which do not cause an Iddq error to occur.

2. A method as claimed in claim 1, wherein said block-by-block logical operation information comprise combinations of block-by-block input logics each being associated with a particular test vector number and varying in synchronism with test vectors sequentially input to an input terminal of the LSI.

3. A method as claimed in claim 1, wherein a given block is determined to be a normal block if all of a plurality of combinations of input logic causing the Iddq error to occur exist in combinations of input logic corresponding to the test vector numbers whose Iddq values are normal, otherwise the given block is determined to be a fault block.

4. A method as claimed in claim 1, wherein a given block is determined to be a normal block if all of a plurality of different kinds of groups of continuous input logics corresponding to continuous ones of the test vector numbers causing the Iddq error to occur exist in a group of combinations of input logics corresponding to continuous ones of the test vector numbers whose Iddq values are normal, or is determined to be a fault block if otherwise.

5. A method as claimed in claim 1, wherein a given block is determined to be a normal block if all of a plurality of kinds of input logic combination groups detected at continuous test vector numbers where an Iddq error is detected and a plurality of kinds of input logic combination groups detected at discontinuous test vector numbers where the Iddq error is not detected exist in an input logic combination group at continuous test vector numbers where the Iddq value are normal and a combination of input logics at test vector numbers where the Iddq value is normal, or is determined to be a fault block if otherwise.

6. A method as claimed in claim 1, wherein a fault occurred in the fault block is narrowed down on the basis of a combination of input logics at the test vector numbers where the Iddq error has occurred.

7. A method as claimed in claim 1, wherein a fault occurring in the fault block is narrowed down on the basis of a combination of input logics at the test vector numbers where the Iddq error has occurred and a combination of input logics at the test vector numbers where the Iddq error has not occurred.

8. A method as claimed in claim 1, wherein a fault in the fault block is narrowed down with each of a combination circuit and a sequential circuit independently.

9. A method as claimed in claim 1, wherein a fault in the fault block is narrowed down with a circuit configuration being sequentially reduced in scale from a plurality of basic logic circuits.

10. A method of detecting a fault in an LSI circuit, comprising the steps of:

applying a series of test vectors to said LSI circuit;

detecting whether each of the applied test vectors results in a normal Iddq value or an abnormal Iddq value;

supplying a logic value of a block of said LSI circuit for each of the applied test vectors; and determining that said block of said LSI circuit does not have a fault when each of the logic values which occur in said block when a test vector is applied which results in an abnormal Iddq also occurs in said block when the test vector is applied which does not result in an abnormal Iddq value, and otherwise determining that the block has a fault.

* * * * *

UNITED STATES PATENT AND TRADEMARK OFFICE
CERTIFICATE OF CORRECTION

PATENT NO. : 6,173,426 B1  
DATED : January 9, 2001  
INVENTOR(S) : Masaru Sanada Page 1 of 1

It is certified that error appears in the above-identified patent and that said Letters Patent is hereby corrected as shown below:

Column 7,  
Line 6, delete "1dda" insert -- Idda --

Column 8,  
Line 6, delete "1dda" insert -- Idda --

Column 9,  
Line 22, delete "bi" insert -- b1 --;  
Line 53, after "and" insert -- 2 --;  
Line 54, after "the" insert -- consecutive test vectors TV1-TV4, as listed below: --

Column 10,  
Line 22, delete "cause" insert -- because --;  
Line 23, after "paths" insert -- 1 --

Signed and Sealed this

Thirtieth Day of October, 2001

*Attest:*

NICHOLAS P. GODICI  
*Attesting Officer*     *Acting Director of the United States Patent and Trademark Office*